United States Patent
Lueck

(10) Patent No.: US 10,454,524 B2
(45) Date of Patent: Oct. 22, 2019

(54) TRISTATE AND CROSS CURRENT FREE OUTPUT BUFFER

(71) Applicant: TESAT-SPACECOM GMBH & CO. KG, Backnang (DE)

(72) Inventor: Volker Lueck, Auenwald (DE)

(73) Assignee: TESAT-SPACECOM GMBH & CO. KG, Backnang (DE)

( * ) Notice: Subject to any disclaimer, the term of this patent is extended or adjusted under 35 U.S.C. 154(b) by 0 days.

(21) Appl. No.: 15/806,472

(22) Filed: Nov. 8, 2017

(65) Prior Publication Data

US 2018/0138942 A1 May 17, 2018

(30) Foreign Application Priority Data

Nov. 11, 2016 (DE) .................. 10 2016 121 696

(51) Int. Cl.
*H04B 7/185* (2006.01)
*H03K 19/23* (2006.01)
(Continued)

(52) U.S. Cl.
CPC ............. *H04B 1/74* (2013.01); *H03K 19/003* (2013.01); *H03K 19/007* (2013.01);
(Continued)

(58) Field of Classification Search
CPC .... H04B 1/74; H04B 7/18515; H03K 19/003; H03K 19/23; H03K 19/09429;
(Continued)

(56) References Cited

U.S. PATENT DOCUMENTS 6,903,571 B1  6/2005  Trimberger
7,036,059 B1  4/2006  Carmichael et al.
(Continued)

FOREIGN PATENT DOCUMENTS

CN   103176945 B    11/2015
WO   2016060617 A1   4/2016

OTHER PUBLICATIONS

The German Patent and Trade Mark Office, Office Action for German Patent Application No. 10 2016 121 696.8 dated Sep. 13, 2017.
(Continued)

*Primary Examiner* — Dong-Chang Shiue
(74) *Attorney, Agent, or Firm* — Lorenz & Kopf LLP

(57) ABSTRACT

A tristate output buffer includes a first branch with a first buffer, and a second branch with a second buffer. The first buffer includes a supply port, a ground port, an output port, two switchable semiconductor elements of a first type, and two switchable semiconductor elements of a second type. Switching behavior of the switchable semiconductor elements of the first type differs from switching behavior of the switchable semiconductor elements of the second type. The two switchable semiconductor elements of the first type are connected in series and are between the supply port and the output port such that they can be put in a conductive state independent of each other. The two switchable semiconductor elements of the second type are connected in series and are between the ground port and the output port such that they can be put in a conductive state independent of each other.

9 Claims, 4 Drawing Sheets

(51) Int. Cl.
*H03K 19/007* (2006.01)
*H04B 1/74* (2006.01)
*H03K 19/003* (2006.01)
*H03K 19/0185* (2006.01)
*H03K 19/094* (2006.01)

(52) U.S. Cl.
CPC . *H03K 19/00338* (2013.01); *H03K 19/00392* (2013.01); *H03K 19/0185* (2013.01); *H03K 19/018521* (2013.01); *H03K 19/094* (2013.01); *H03K 19/09429* (2013.01); *H03K 19/23* (2013.01); *H04B 7/18515* (2013.01)

(58) Field of Classification Search
CPC ......... H03K 19/094; H03K 19/018521; H03K 19/0185; H03K 19/007; H03K 19/00392; H03K 19/00338
See application file for complete search history.

(56) References Cited

U.S. PATENT DOCUMENTS

| | | | |
|---|---|---|---|
| 9,191,009 B1* | 11/2015 | Clark | H03K 19/23 |
| 9,699,009 B1* | 7/2017 | Ainspan | H04L 25/4917 |
| 2005/0156620 A1 | 7/2005 | Carlson | |
| 2009/0189634 A1 | 7/2009 | Rezgui et al. | |

OTHER PUBLICATIONS

European Patent Office, Extended European Search Report for European Patent Application No. 17200919.3 dated Mar. 9, 2018.

\* cited by examiner

TRISTATE AND CROSS CURRENT FREE OUTPUT BUFFER

CROSS-REFERENCE TO PRIORITY APPLICATION

This application claims the benefit of, and priority to, German patent application number DE 102016121696.8, filed Nov. 11, 2016. The content of the referenced application is incorporated by reference herein.

TECHNICAL FIELD

The present description relates to the field of data and signal processing, in particular to the field of redundant data and signal processing. A tristate output buffer is described which may be used in redundant data processing systems, for example. In addition, such a data processing system is provided, as well as a spacecraft like a communication satellite, for example, with such a data processing system.

BACKGROUND

Typically, redundant data processing is utilized in safety-related applications or in environments that are susceptible to malfunctioning (prone to breakdown), that is if either a high standard is placed to reliability of a result of a processing step or if failures or malfunctions cannot be avoided or are to be expected due to the operation environment.

Electronic circuits, in particular circuits that are built up at least in part with semiconductor elements, may be exposed to radiation under conditions in outer space out of the earth's atmosphere, which radiation may result in undesired behavior or malfunction of the semiconductor elements. In particular, it may happen that under the influence of such radiation the behavior of the semiconductor elements may deviate or differ from a functional or expected behavior.

Digital electronic circuits that are designed in a redundant manner for the purpose of suppressing radiation-related malfunctions must typically resolve the redundancy at their output interfaces. So-called output buffers are used for this purpose. Here, the output buffers may be a residual sensitive part as these, in turn, may be susceptible to malfunctioning or may have an impact on voltage drops and/or drive strength losses (drop of the current provided at the output interface).

In particular, the output buffer may be a tristate output buffer, which means that it may take the three logical values "1", "0", "high impedance" at its output interface.

BRIEF SUMMARY

There may be a need for a tristate redundant output buffer that does not suffer the disadvantages indicated above or that suffers the disadvantages only to a reduced extent.

According to a first aspect, a tristate output buffer is provided. The output buffer comprises a first branch with a first buffer and a second branch with a second buffer. Here, the first buffer comprises: a supply port, a ground port, an output port, two switchable semiconductor elements of a first type and two switchable semiconductor elements of a second type. A switching behavior of the switchable semiconductor elements of the first type differs from a switching behavior of the switchable semiconductor elements of the second type, wherein the two switchable semiconductor elements of the first type are connected in series and are arranged between the supply port and the output port such that they can be put in a conductive state independently of each other, and wherein the two switchable semiconductor elements of the second type are connected in series and are arranged between the ground port and the output port such that they can be put in a conductive state independently of each other.

An output buffer is an arrangement of components at the output port of a circuit in order to provide an output value for further processing. A so-called tristate output buffer is designed such that it can take the three values logical "1", logical "0", and "high impedance" at its output port. The logical states 1 and 0 may be assigned specific voltage levels or ranges of voltage levels, so that these states can be detected or identified. The desired state at the output port of the output buffer is provided in that either the supply port or the ground port is electrically connected with the output port in a deliberate manner, i.e., that the corresponding semiconductor elements are put in an electrically conductive state. In redundant electronic circuits (that is, if multiple circuit branches are present which perform an operation in a concurrent manner so that multiple values are available as the result), output buffers are also used to resolve the redundancy, that is to aggregate the multiple redundant values to a single output value.

For the purposes of this description, a semiconductor element especially is a switch element that can take a conductive state or a non-conductive state depending on a control signal. For example, this may be a switch element being based on semiconductor material, like a transistor. However, this may also be any other switch element that fulfils the function indicated above.

The semiconductor elements taken into consideration for the purposes of this description are of different type. For example, either self-conducting (normally open) or self-closing (normally closed) field-effect transistors may be used, which are typically referred to as depletion type or enhancement type. In particular, the semiconductor elements of the first type may be self-closing p-channel transistors, in particular field-effect transistors. In particular, the semiconductor elements of the second type may be self-closing n-channel transistors, in particular field-effect transistors. It thus appears that only one of the two is conductive and the other is non-conductive when the same voltage level is applied to the respective control port.

The fact that both semiconductor elements between supply port and output port are switchable independent of each other means that their control signal is composed differently and takes an individual path (i.e., a different logical and/or structural path) through the circuit arrangement, respectively, which path at least partially differs from the path of the other control signal. For example, it may be ensured by this that a single error in controlling the semiconductor elements does not result in or lead to unintended connecting through of the supply port to the output port (or even to the ground port). The same applies in a similar manner and conversely to the two semiconductor elements that are arranged between the ground port and the output port.

In total, two semiconductor elements are arranged between the output port and the supply port and two semiconductor elements are arranged between the output port and the ground port, and totally four semiconductor elements are arranged between the supply port and the ground port. The safety against an incorrect connecting through of the supply port or of the ground port to the output port or even of the supply port to the ground port is increased as a result of the type of the semiconductor elements and due to their arrangement (position) and controlling.

Summing up, the output buffer described herein is comprised of at least two single buffers connected in parallel, wherein each single buffer has four individually controllable semiconductor elements which may be output transistors, for example. The semiconductor elements are redundant. Hence, the output buffer has the advantage that it is free of cross currents even in case of an error and no or no substantial drop of the voltage level at the output port occurs, so that a high level of certainty in level detection (differentiating between the voltage levels for logical "1" and "0") is provided. Also, the output buffer described herein is a tristate output buffer.

Due to the design described herein, radiation-related effects may be reduced, in particular in outer space, i.e., out of the earth's atmosphere, and there does not exist the drawback that a cross current flows through the buffers in case of a malfunction, which cross current drastically reduces the driving capability and results in a drop of the voltage level.

According to an embodiment, the second buffer comprises the same elements as the first buffer and the elements of the second buffer are also interconnected with each other in a manner as the corresponding elements of the first buffer.

Here, reference is made to the description of the first buffer, in order not to repeat everything at this point. The description of the first buffer applies to the second buffer in an analogue manner. In a redundant circuit design, the first buffer is assigned to one of the multiple redundant signals and the second buffer is assigned to another one of these multiple redundant signals. Each of the first buffer and the second buffer provide an output signal, wherein these output signals of the first and second buffer are aggregated to resolve the redundancy and to achieve the single output signal of the output buffer.

According to a further embodiment, the tristate output buffer furthermore comprises a third branch with a third buffer, wherein the third buffer comprises the same elements as the first buffer and the elements of the third buffer are also interconnected in the same manner as the elements of the first buffer.

Here, reference is also made to the description of the first buffer, in order not to repeat everything at this point. The description of the first buffer applies to the third buffer in an analogue manner. In a redundant circuit design, the first buffer is assigned to one of the multiple redundant signals and each of the second and the third buffers is assigned to another one of these multiple redundant signals. Each of the first buffer and the second buffer and the third buffer provide an output signal, wherein these output signals of the first, second, and third buffer are aggregated to resolve the redundancy and to achieve the single output signal of the output buffer.

For example, as a result of the design with three buffers, each of which is arranged in one branch, also a malfunction in an entire branch can be compensated, if, for example, a buffer provides a completely incorrect signal. In case a buffer outputs an incorrect signal, there are still two other buffers outputting a correct signal. Apart from this redundancy, also the individual buffers are designed such that they can handle internal errors (errors within a buffer) themselves, or that they can handle a single incorrect input signal, i.e., to compensate this, and thereby providing a correct value.

According to a further embodiment, each branch of the group that includes the first branch and the second branch comprises a first signal interface and a second signal interface, wherein at least in the first branch and the second branch the respective first signal interface is guided directly to a control port of a first semiconductor element of the first type.

As already discussed above, the semiconductor elements are in particular transistors, e.g., field-effect transistors or also bipolar transistors. Each semiconductor element comprises at least three ports or connectors, namely a source (inflow), a drain (outflow), and a gate (control port). The control port is configured to, in case of an applied voltage or an applied current, put the section between source and drain from a non-conductive state to a conductive state or vice versa.

Likewise, the third branch may comprise a first and a second signal interface. These two signal interfaces of all buffers are configured to provide a signal, e.g., an electric voltage level or also a current, to the buffers, in particular to the control port of the semiconductor elements. Based on this signal, the buffers provide their respective output signal. It is noted that the signals of the signal interfaces may be processed prior to feeding these to a control port of a buffer. This will be described below in one embodiment.

According to a further embodiment, at least in the first branch and in the second branch, the respective second signal interface is fed directly to a control port of a first semiconductor element of the second type.

According to a further embodiment, each branch of the group that includes the first branch, the second branch, and the third branch comprises a majority decision unit, wherein each majority decision unit comprises a first majority voter with an input interface that is coupled with all of the first signal interfaces of the first branch, the second branch, and the third branch, and which first majority voter is configured to determine a first majority value based on values of the connected first signal interfaces and to output the first majority value at an outbound interface, wherein the outbound interface of the first majority voter is guided or fed directly to a control port of a second semiconductor element of the first type.

The consequence of this is that the second semiconductor element of the first type, i.e., of those semiconductor elements which are arranged between the supply port and the output, switches only if a majority decision based on the values of the three signal interfaces comes to a result that the corresponding value may change the state of the semiconductor element. In other words, the assigned semiconductor element switches from the conductive state to the non-conductive state or vice versa only if the majority decision on the three first signal interfaces comes to a corresponding result. This provides a certain degree of fault tolerance and even enables correction of errors, namely if there is an error on a single signal interface.

Hence, to feed the supply port to the output port in a buffer, it is required that two serially connected semiconductor elements that are arranged between the supply port and the output port are switched to the conductive state (or are left in the conductive state), wherein the first semiconductor element is switched or controlled via a single signal interface and the second semiconductor element is switched or controlled via a majority decision of three signal interfaces of all three branches.

According to a further embodiment, each majority decision unit comprises a second majority voter, wherein the second majority voter has an input interface that is coupled with all of the second signal interfaces of the first branch, the second branch, and the third branch, and which second majority voter is configured to determine a second majority value based on values of the connected second signal interfaces and to output the second majority value at an outbound interface, wherein the outbound interface of the second majority voter is guided or fed directly to a control port of a second semiconductor element of the second type.

In an analogue manner to the semiconductor elements between supply port and output port, it also applies here that two semiconductor elements of the same type are arranged between the ground port and the output port and are arranged in series, wherein, however, the semiconductor elements between the ground port and the output port are of a different type than the semiconductor elements between the supply port and the output port, as already described above. Hence, in order to feed the ground port to the output port, both semiconductor elements at this position must be in the conductive state. As already described above, these two semiconductor elements are controlled by separate signals, one directly via the second signal interface and the second one via the second majority value at the output port of the second majority voter.

According to a further embodiment, at least the output port of the first buffer and an output port of the second buffer are connected together and form an output port of the tristate output buffer.

According to a further embodiment, the first signal interface and the second signal interface of at least the first branch and the second branch are configured to transmit digital signals.

Hence, a majority decision based on the logical values of the signal interfaces is possible in a simple manner, as it must be distinguished only between two defined signal states or signal value ranges (voltage range or current range), and not according to analogue values of the signals.

According to a further embodiment, the two switchable semiconductor elements of the first type are P-channel field-effect transistors.

According to a further embodiment, the two switchable semiconductor elements of the second type are N-channel field-effect transistors.

The switchable semiconductor elements of the first type and those of the second type are different and have a different switching behavior. This means, for example, that the N-channel FETs go into the non-conductive state in case of an applied control signal and the P-channel FETs do not go into the non-conductive state with the same control signal or even go into the conductive state, or vice versa. As the semiconductor elements of the first type are arranged between supply port and output port and those of the second type are arranged between ground port and output port, it may be ensured that no cross current flows from the supply port to the ground port, as the semiconductor elements of the first type and those of the second type are not in the conductive state at the same time.

According to another aspect, a data processing system is provided that is configured to generate and output an output value. The data processing system comprises a tristate output buffer as described in the present document. The data processing system is configured to provide signal values in a redundant manner and to transmit the signal values at least to the first branch and to the second branch of the tristate output buffer.

The data processing system may be any device that is suitable for automated processing and output of data. In this case, the data processing system is designed in a redundant manner. This means that an operation is executed and also the data transmission is done via at least two separate paths.

It is also conceivable that the data processing system is designed in a double-redundant manner, i.e., that in total three paths are provided via which data are processed and transmitted. In case of the double-redundancy, the output buffer is designed such that it comprises as many branches as the data processing system comprises paths. Of course, it is possible that the data processing system comprises more than three redundancy paths, wherein the output buffer may then be designed correspondingly. Preferably, the total number of redundancy paths is an odd number, so that an unambiguous majority decision can be taken in any case.

Furthermore, a spacecraft is provided which comprises a data processing system as described above.

In particular, in vehicles that are provided for being used and operated out of the earth's atmosphere (is referred to herein as outer space), redundancy concepts are being used. This is due to the fact that an intervention of a human operator is not possible in a simple manner and on the other hand because especially electric and electronic components are exposed to interferences in outer space which do not or substantially not occur when being used on earth due to the characteristics of the atmosphere. For example, such interferences are based on ionizing radiation which may impact the functioning of semiconductor elements and which may result in malfunctioning. In order to reduce the impacts of such interferences, functions are executed in a redundant manner, for example by redundantly existing components. The output buffer as described above is configured to take or to receive the output values of redundant components and to generate and provide a single output value based thereon, wherein the output buffer can take the three values logical "1", logical "0", and "high impedance" at its output port.

According to a further embodiment, the spacecraft is a communication satellite.

In this context, a communication satellite shall be understood as any spacecraft for being used in outer space or out of the earth's atmosphere, which spacecraft is equipped to transmit or receive data to or from the earth, or to or from another spacecraft or aircraft.

According to a further embodiment, the data processing system is arranged in a data transmission path of the communication satellite.

Hence, in an initial step, the data to be transmitted, or received and processed data are provided via redundant paths (after the data were optionally also processed in a redundant manner) and the data processing system together with the tristate output buffer provide a single output value at the output port of the tristate output buffer, wherein the tristate output buffer can take the three values logical "1", logical "0", and "high impedance" in digital or logical nomenclature at this output port. For the sake of completeness, it is noted that at one point of time t, typically only one of these three indicated values is provided at the output port of the output buffer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

In the following, exemplary embodiments are described in more detail with reference to the attached drawings. The drawings are schematic and not to scale. Same reference signs refer to same or similar elements. It is shown in.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Figure 1:
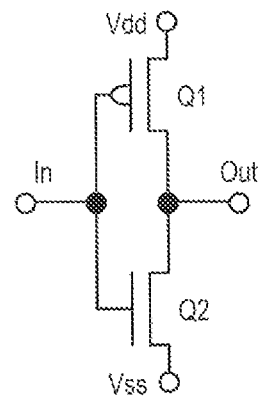
FIG. 1 a schematic representation of a single output buffer.

FIG. 1 shows a single inverting output buffer which is designed as a CMOS output buffer in this example. The output buffer is made of two driver transistors Q1 and Q2 which are driven inversely and, hence, establish a connection of the output port Out either to the positive supply voltage Vdd or to ground Vss.

One can easily recognize in FIG. 1 that normally and in any case only one of the two transistors Q1, Q2 is conductive and that in case of an interference or malfunction of the non-conductive transistor—it may become conductive as a result of the interference—both transistors are conductive and, hence, a cross current arises from Vdd to Vss. In most cases, such a cross current is unwanted as it negatively impacts the smoot function of the output buffer and, for example, reduces the drive strength at the output port due to the cross current, even to a nil rate. This may be referred to as malfunctioning of the output buffer.

In case of an interference at the input port In, i.e., that the signal value at the input port In does not correspond to the correct signal value, this interference is fed to the output port and a cross current does not necessarily occur in this case. In this case, there is no malfunctioning of the output buffer as the error already existed when supplying the input signal.

These two types of malfunction (malfunction of the output buffer and malfunction during processing and providing of the input signal) may of course exist in combination.

In order to eliminate or to reduce the effect of interferences at the input ports, the internal circuits which provide the input signals In of the output buffer are often designed in a redundant manner, for example triple redundant, which approach results in a multiplication (e.g. triplication) of the output buffers.

Figure 2:
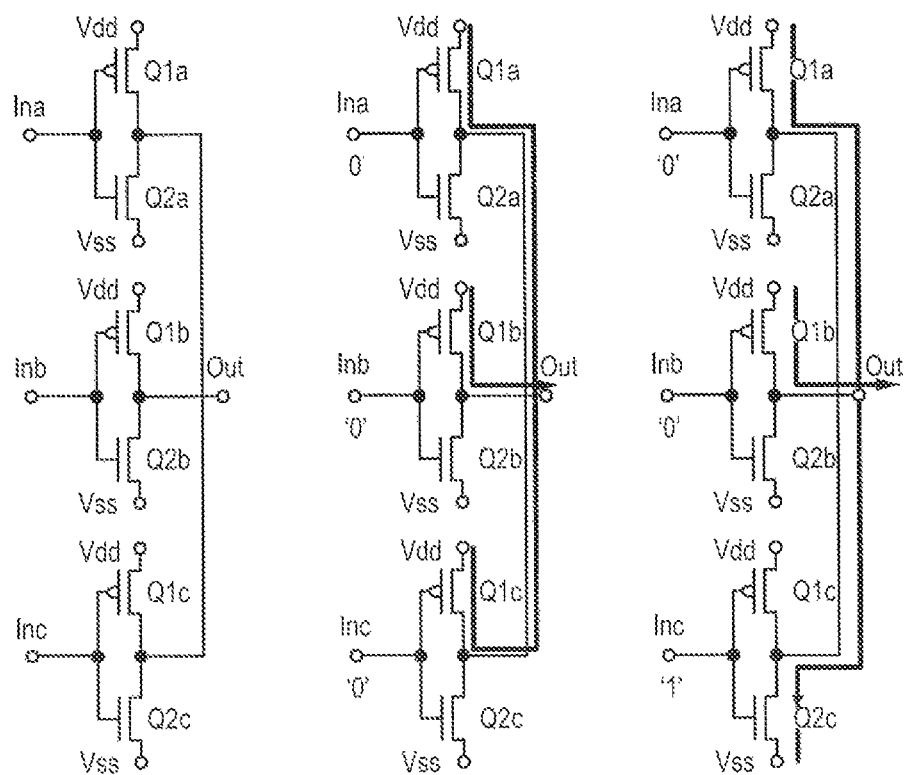
FIG. 2 a schematic representation of a triple redundant output buffer.

An output buffer that is configured for receiving triple redundant signals is shown in FIG. 2.

It can be recognized in FIG. 2 that in case of three signals Ina, Inb, and Inc that are identical in the desired condition, Q1$a$, Q1$b$, and Q1$c$ or Q2$a$, Q2$b$, and Q2$c$ are conductive.

Likewise, it can be recognized that in case of different signal values on the lines Ina, Inb, Inc, a cross current from Vdd to Vss is generated.

FIG. 2 shows on the left the triple redundant output buffer in a basic configuration or initial state. In the middle, the state is shown in which the transistors Q1$a$, Q1$b$, Q1$c$ are conductive and the transistors Q2$a$, Q2$b$, Q2$c$ are non-conductive. The output currents of the transistors Q1$a$, Q1$b$, Q1$c$ add up and are output to the output port. FIG. 2 shows on the right the case of failure that additionally to the transistors Q1$a$ and Q1$b$ the transistor Q2$c$ is conductive (instead of Q1$c$) as, for example, the input signal Inc deviates from the input signals Ina and Inb in a faulty manner. In this case, a cross current flows from Vdd to Vss due to the conductive transistor Q2$c$ and the drive strength at the output port is reduced.

And of course, a cross current may furthermore be generated if an actually non-conductive output transistor Q1$a$, Q1$b$, Q1$c$ or Q2$a$, Q2$b$, Q2$c$ becomes conductive due to radiation influences although the related input signal Ina, Inb, Inc has not put the disrupted or disturbed transistor into the conductive state.

Figure 3:
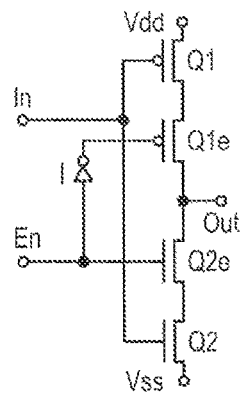
FIG. 3 a schematic representation of a single tristate output buffer.

FIG. 3 shows an approach with which the risk of a cross current may be reduced. The risk of a cross current due to a single disturbed output transistor may be reduced and eliminated for example by using at least two transistors for connecting through from Vdd or Vss, respectively, to the output port. Such a circuit is used for tristate buffers in many cases, wherein the in sum four transistors Q1, Q1$e$, Q2, Q2$e$ are already connected together logically.

In the representation of FIG. 3, it can be recognized that two transistors must be connected through, respectively, in order to establish a connection from Vdd or Vss to output port Out. Here, the transistors Q1$e$ and Q2$e$ (may also be referred to as so-called "enable transistors") are connected such that they are both either conductive or non-conductive, independent of data bit In. The line In may also be referred to as data bit, wherein thereby the signal value is meant which is transmitted via the signal line In. The transistors Q1$e$ and Q2$e$ are driven via an individual signal line En.

In case of a disrupted or interfered signal value In, that one of the three output buffers may be disabled by using line En, the data value In of which differs from the data value of the other two. In case of no malfunction, the enable-transistors are conductive and they prevent a cross current through two buffers in case of an interfered input data bit In. However, as both enable-transistors Q1$e$ and Q2$e$ are conductive, this circuit does not prevent a cross current in case the malfunction is located in the transistors Q1 or Q2.

Figure 4:
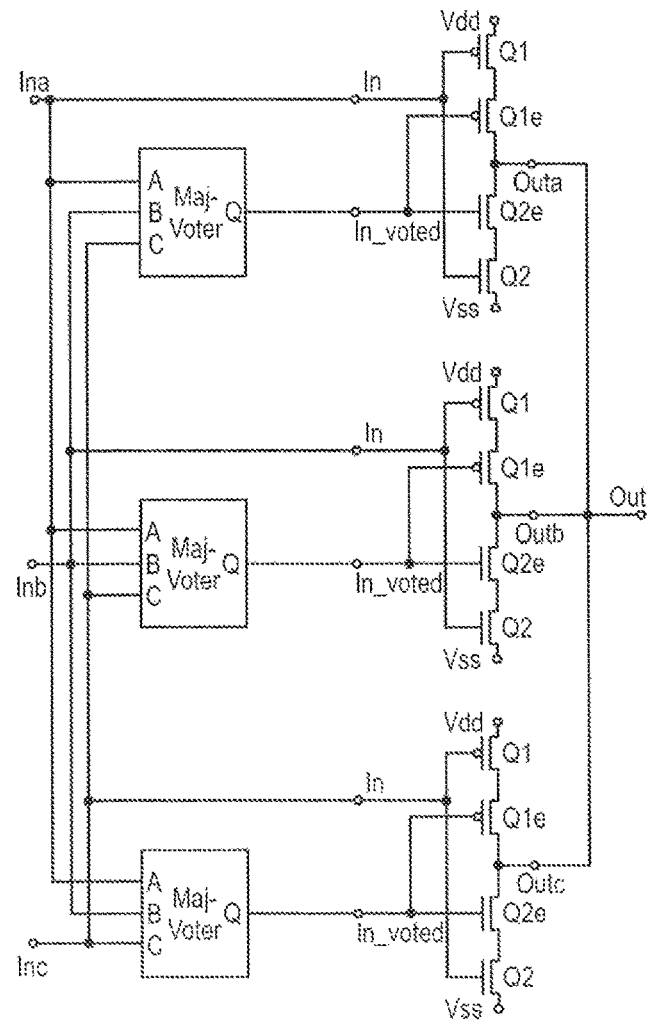
FIG. 4 a schematic representation of a cross current free triple redundant output buffer.

Further to the representation shown in FIG. 3, it is shown in FIG. 4 that the two transistors Q1$e$ and Q2$e$ are driven such that in each case only one of the two transistors is conductive. This may be achieved by omitting the internal inverter I. The result of a majority decision of the three input signals may be chosen as control signal for the modified input port. Therefore, one majority voter is provided, respectively, which is supplied with the three input signals Ina, Inb, Inc, and the output port of which is used as a control signal for the enable-transistors.

Figure 5:
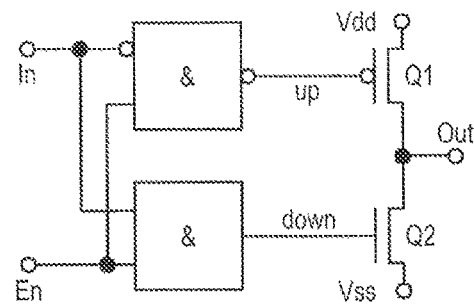
FIG. 5 a schematic representation of the logic function of a tristate output buffer.

FIG. 5 shows a further basic option to design a tristate output buffer. This further option is comprised of operating a buffer consisting of only two transistors with two independent input signals, wherein a logic aggregation or combination between input data and enable-signal is used for driving.

For the sake of simplicity, the driving signals for the transistors Q1 and Q2 may be referred to as "up" and "down". Instead of providing the signals In and En by a circuit logic, now up and down are generated and provided.

Figure 7:
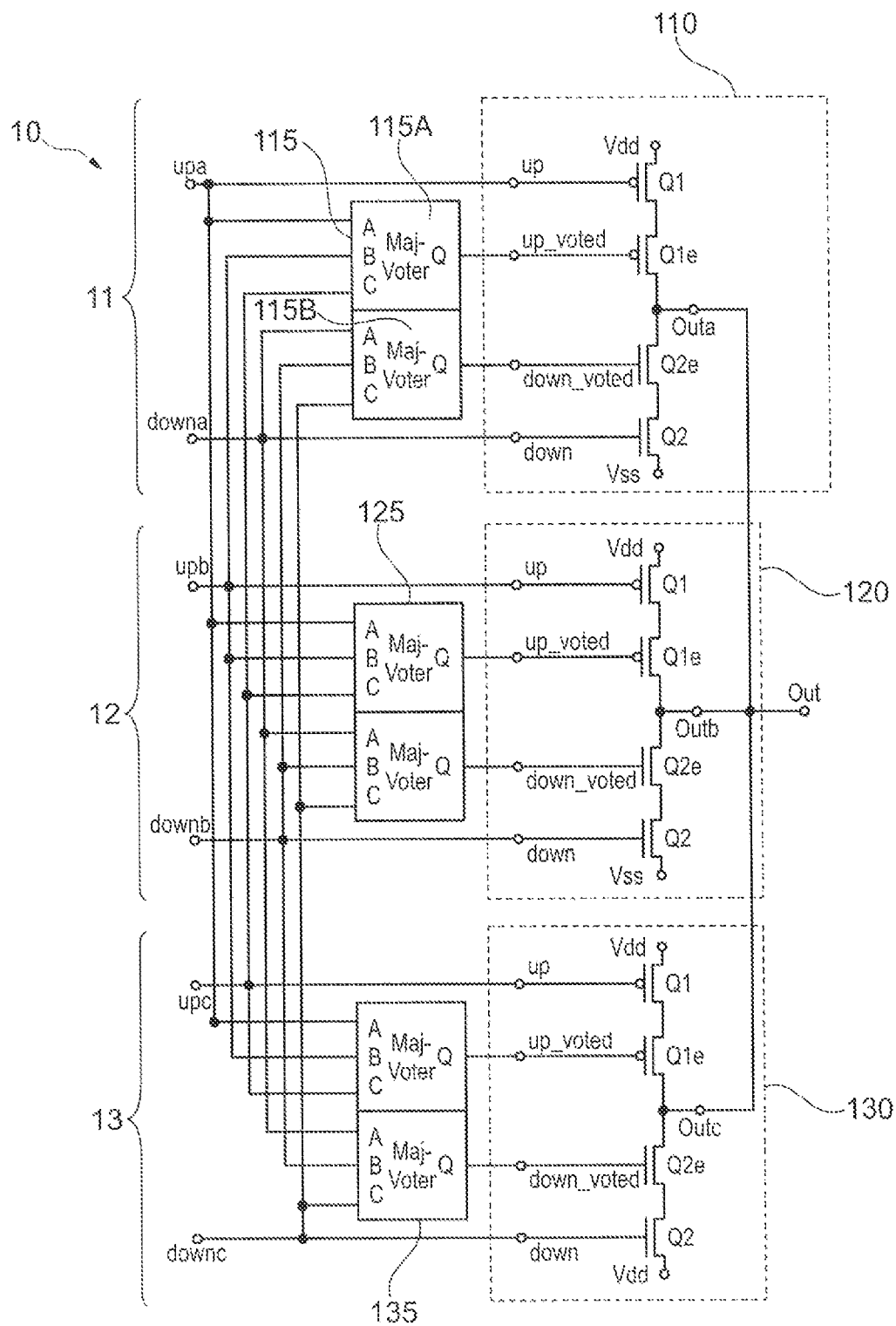
FIG. 7 a schematic representation of a cross current free triple redundant tristate output buffer.

By applying the above-described approach of the double redundancy for connecting through a path to an output port, the overall view for a redundant cross-current free tristate output buffer shown in FIG. 7 is achieved.

FIG. 7 shows an output buffer 10 with three branches 11, 12, 13. Each branch is fed with two signals up and down and comprises a majority decision unit 115 with two majority voters 115A, 115B. In this example, the majority voters receive three input signals which may especially take two signal states logic "1" and logic "0". For example, if the same signal is provided to all three input ports of the majority voter, this signal is fed to the output port Q. If one signal value differs from the two others, the signal value of the two others is fed to the output port Q.

In the following, the circuitry of the majority voters 115A, 115B with the input signals upa, downa and the transistors Q1, Q1e, Q2, Q2e of the first branch 11 is described. This description applies in a similar manner to the second branch 12 and to the third branch 13. The three up-signals of the branches 11, 12, 13 are fed to the first majority voter 115A, and a majority signal is determined and is fed to the output port Q. The same happens with the second majority voter 115B with the three down-signals of the three branches 11, 12, 13. The output port Q of the first majority voter 115A is used as a control signal for the transistor Q1e and the output port Q of the second majority voter 115B serves as a control signal for the transistor Q2e. In addition, the transistors Q1 and Q2 are directly controlled by the up and down signals of the first branch.

Hence, in order to feed Vdd to Outa, it is required that the signal upa and the output Q of the majority voter 115A transitions the transistors Q1 and Q1e into the conductive state. The same must happen in a similar manner for connecting through Vss to Outa.

Due to the fact that the proposed buffer stage does not generate any cross currents or reduces the likelihood of arising cross currents, a merely double redundancy instead of the triple redundancy shown up to now is also possible as the malfunctioning or disrupted buffer does not make any contribution to the output signal Out of the output buffer. In this case, the drive strength would be reduced by one half, the voltage level would not drop.

Figure 6:
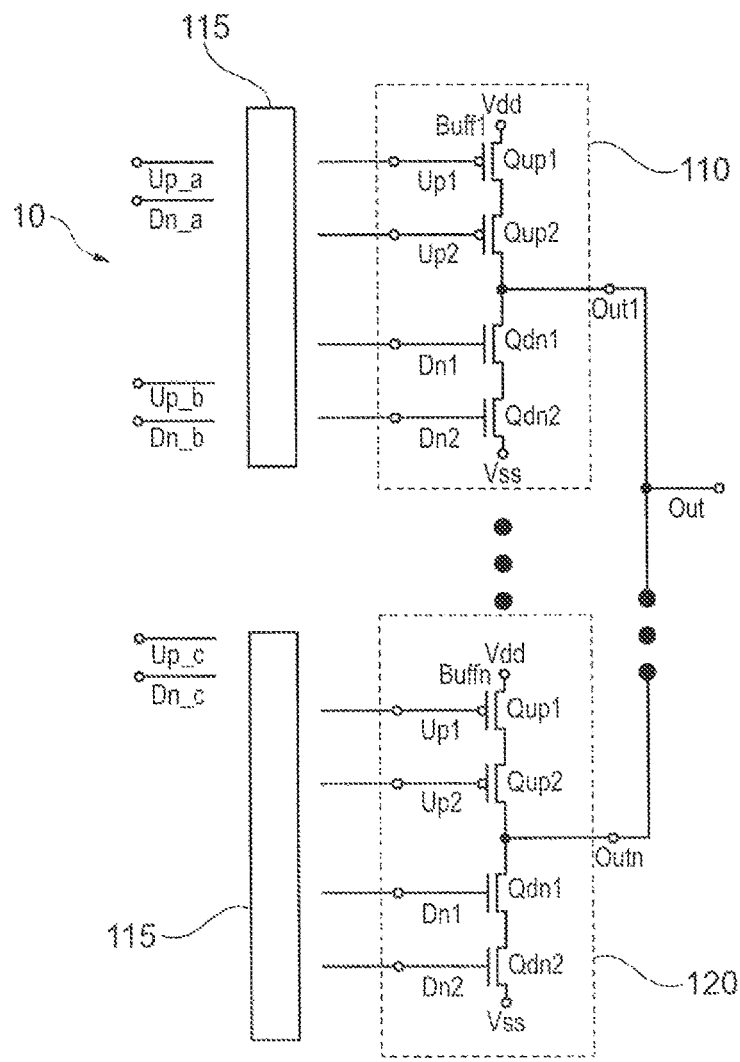
FIG. 6 a schematic representation of a cross current free triple redundant tristate output buffer.

This generalization is shown in FIG. 6. Generally speaking, the inventive output buffer 10 as shown in FIG. 7 includes an at least dual parallel circuit of single buffers Buff1 110 . . . Buffn 120, each of which comprises (or consists of) a series circuit of two transistors between Vdd and output port Out1 (Qup1 and Qup2) and between Vss and output port Out1 (Qdn1 and Qdn2), which series circuit can be switched conductive independently of each other, and which parallel circuit is connected such that in case there is no malfunction the transistors connected in series to each other are both either conductive or non-conductive, which has the effect that in case of a malfunction, the series circuit comprises (or consists of) a conductive and a non-conductive transistor and, hence, the connection from Vdd or Vss to output port Out1 is blocked or disabled and the malfunctioning single buffer does not provide any contribution to the output port Out of the entire circuit of the output buffer 10.

The input signals up or down of the respective branches are fed or connected to the control lines of the individual buffers 110, 120 via the majority decision unit 115, as is shown in FIG. 7.

Additionally, it is noted that "comprising" or "including" does not exclude any other elements or steps and "a" or "an" does not exclude a multitude or plurality. It is further noted that features or steps which are described with reference to one of the above exemplary embodiments may also be used in combination with other features or steps of other exemplary embodiments described above. Reference signs in the claims are not to be construed as a limitation.

LIST OF REFERENCE NUMBERS 10 tristate output buffer
11 branch
12 branch
13 branch
110 buffer
115 majority decision unit
115A first majority voter
115B second majority voter
120 buffer
125 majority decision unit
130 buffer
135 majority decision unit While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:
1. A tristate output buffer, comprising:
  a first branch comprising:
    a first input signal interface for a first input signal;
    a first enable signal interface for a first enable signal;
    a first majority decision circuit coupled to receive the first input signal and the first enable signal; and
    a first buffer circuit coupled to the first majority decision circuit, the first buffer circuit comprising: a first supply voltage port, a first ground voltage port, a first output port, two switchable semiconductor elements of a first type connected in series between the first supply voltage port and the first output port, and two switchable semiconductor elements of a second type connected in series between the first ground voltage port and the first output port; and
  a second branch comprising:
    a second input signal interface for a second input signal;
    a second enable signal interface for a second enable signal;
    a second majority decision circuit coupled to receive the second input signal and the second enable signal; and
    a second buffer circuit coupled to the second majority decision circuit, the second buffer circuit comprising: a second supply voltage port, a second ground voltage port, a second output port, two switchable semiconductor elements of the first type connected in series between the second supply voltage port and the second output port, and two switchable semicon- ductor elements of the second type connected in series between the second ground voltage port and the second output port;

wherein a switching behavior of the switchable semiconductor elements of the first type differs from a switching behavior of the switchable semiconductor elements of the second type;

wherein conductive states of the switchable semiconductor elements of the first buffer circuit and the second buffer circuit are independently controllable using the first input signal, the first enable signal, output of the first majority decision circuit, the second input signal, the second enable signal, and output of the second majority decision circuit; and wherein the first output port of the first buffer circuit is connected to the second output port of the second buffer circuit to form an output port of the tristate output buffer.

2. The tristate output buffer of claim 1, wherein the switchable semiconductor elements of the first type are P-channel field-effect transistors.

3. The tristate output buffer of claim 1, wherein the switchable semiconductor elements of the second type are N-channel field-effect transistors.

4. The tristate output buffer of claim 1, further comprising:
a third branch comprising:
a third input signal interface for a third input signal;
a third enable signal interface for a third enable signal;
a third majority decision circuit coupled to receive the third input signal and the third enable signal; and
a third buffer circuit coupled to the third majority decision circuit, the third buffer circuit comprising: a third supply voltage port, a third ground voltage port, a third output port, two switchable semiconductor elements of the first type connected in series between the third supply voltage port and the third output port, and two switchable semiconductor elements of the second type connected in series between the third ground voltage port and the third output port;
wherein conductive states of the switchable semiconductor elements of the first buffer circuit, the second buffer circuit, and the third buffer circuit are independently controllable using the first input signal, the first enable signal, output of the first majority decision circuit, the second input signal, the second enable signal, output of the second majority decision circuit, the third input signal, the third enable signal, and output of the third majority decision circuit.

5. The tristate output buffer of claim 4, wherein:
in the first branch:
the first majority decision circuit comprises a first majority voter circuit comprising an input interface that is coupled with the first input signal interface of the first branch, the second input signal interface of the second branch, and the third input signal interface of the third branch;
the first majority voter circuit is configured to determine a first majority value based on values of the first input signal, the second input signal, and the third input signal;
the first majority voter circuit is configured to output the first majority value at a first outbound interface; and the first outbound interface of the first majority voter circuit is fed directly to a control port of one of the two switchable semiconductor elements of the first type in the first branch;
in the second branch:
the second majority decision circuit comprises a second majority voter circuit comprising an input interface that is coupled with the first input signal interface of the first branch, the second input signal interface of the second branch, and the third input signal interface of the third branch;
the second majority voter circuit is configured to determine a second majority value based on values of the first input signal, the second input signal, and the third input signal;
the second majority voter circuit is configured to output the second majority value at a second outbound interface; and
the second outbound interface of the second majority voter circuit is fed directly to a control port of one of the two switchable semiconductor elements of the first type in the second branch; and
in the third branch:
the third majority decision circuit comprises a third majority voter circuit comprising an input interface that is coupled with the first input signal interface of the first branch, the second input signal interface of the second branch, and the third input signal interface of the third branch;
the third majority voter circuit is configured to determine a third majority value based on values of the first input signal, the second input signal, and the third input signal;
the third majority voter circuit is configured to output the third majority value at a third outbound interface; and
the third outbound interface of the third majority voter circuit is fed directly to a control port of one of the two switchable semiconductor elements of the first type in the third branch.

6. The tristate output buffer of claim 1, wherein:
in the first branch:
the first majority decision circuit comprises a fourth majority voter circuit comprising an input interface that is coupled with the first enable signal interface of the first branch, the second enable signal interface of the second branch, and the third enable signal interface of the third branch;
the fourth majority voter circuit is configured to determine a fourth majority value based on values of the first enable signal, the second enable signal, and the third enable signal;
the fourth majority voter circuit is configured to output the fourth majority value at a fourth outbound interface; and
the fourth outbound interface of the fourth majority voter circuit is fed directly to a control port of one of the two switchable semiconductor elements of the second type in the first branch; in the second branch;
the second majority decision circuit comprises a fifth majority voter circuit comprising an input interface that is coupled with the first enable signal interface of the first branch, the second enable signal interface of the second branch, and the third enable signal interface of the third branch;

the fifth majority voter circuit is configured to determine a fifth majority value based on values of the first enable signal, the second enable signal, and the third enable signal;
the fifth majority voter circuit is configured to output the fifth majority value at a fifth outbound interface; and
the fifth outbound interface of the fifth majority voter circuit is fed directly to a control port of one of the two switchable semiconductor elements of the second type in the second branch; and in the third branch:
the third majority decision circuit comprises a sixth majority voter circuit comprising an input interface that is coupled with the first enable signal interface of the first branch, the second enable signal interface of the second branch, and the third enable signal interface of the third branch;
the sixth majority voter circuit is configured to determine a sixth majority value based on values of the first enable signal, the second enable signal, and the third enable signal;
the sixth majority voter circuit is configured to output the sixth majority value at a sixth outbound interface; and
the sixth outbound interface of the sixth majority voter circuit is fed directly to a control port of one of the two switchable semiconductor elements of the second type in the third branch.

7. The tristate output buffer of claim 1, wherein:
in the first branch, the first input signal interface is fed directly to a control port of one of the two switchable semiconductor elements of the first type; and
in the second branch, the second input signal interface is fed directly to a control port of one of the two switchable semiconductor elements of the first type.

8. The tristate output buffer of claim 1, wherein:
in the first branch, the first enable signal interface is fed directly to a control port of one of the two switchable semiconductor elements of the second type; and
in the second branch, the second enable signal interface is fed directly to a control port of one of the two switchable semiconductor elements of the second type.

9. The tristate output buffer of claim 1, wherein the first input signal interface of the first branch and the second input signal interface of the second branch are configured to transmit digital signals.

* * * * *